United States Patent
Miyamoto et al.

(10) Patent No.: US 6,461,935 B2
(45) Date of Patent: Oct. 8, 2002

(54) METHOD OF MANUFACTURING TRENCH-SHAPED ISOLATOR

(75) Inventors: Shoichi Miyamoto; Toshiaki Iwamatsu; Takashi Ipposhi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/989,152

(22) Filed: Nov. 21, 2001

(65) Prior Publication Data
US 2002/0031881 A1 Mar. 14, 2002

Related U.S. Application Data

(62) Division of application No. 09/371,027, filed on Aug. 10, 1999, now Pat. No. 6,372,599.

(30) Foreign Application Priority Data

Jan. 14, 1999 (JP) .............................. 11-007970

(51) Int. Cl.$^7$ .............................. H01L 21/76
(52) U.S. Cl. ................... 438/424; 438/296; 438/435; 257/510; 257/513
(58) Field of Search ................. 438/221, 296, 438/424, 425, 701, 704; 257/499, 500, 501, 506, 510

(56) References Cited

U.S. PATENT DOCUMENTS

| | | | | |
|---|---|---|---|---|
| 5,521,422 A | * | 5/1996 | Mandelman et al. | 257/510 |
| 5,801,083 A | * | 9/1998 | Yu et al. | 438/424 |
| 6,117,734 A | | 9/2000 | Nakamura | 438/268 |
| 6,144,072 A | | 11/2000 | Iwamatsu et al. | 257/347 |
| 6,180,466 B1 | * | 1/2001 | Ibok | 438/296 |
| 6,198,150 B1 | * | 3/2001 | Gelzinis | 257/510 |

FOREIGN PATENT DOCUMENTS

| | | |
|---|---|---|
| JP | 6-216230 | 8/1994 |
| JP | 7-153833 | 6/1995 |
| JP | 7-254638 | 10/1995 |
| JP | 09008118 A | 1/1997 |

OTHER PUBLICATIONS

"Scalability of Partially Depletted SOI Technology for Sub–0.25 μm Logic Applications", R. Chau et al., 1997 IEDM (Tech. Dig.), p. 591–594.

"Physical and Electrical Characterization and Optimization of Mesa Isolation for 0.35/0.25μm SOI", K. Joyner et al., 1996 IEEE International SOI Conference, pp. 104–105.

* cited by examiner

Primary Examiner—David Nelms
Assistant Examiner—Dung A Le
(74) Attorney, Agent, or Firm—McDermott, Will & Emery

(57) ABSTRACT

A semiconductor device having a trench-shaped isolator, adjacent to the semiconductor element region is formed having a width which is continuously decreased in the downward direction for relaxing the stress in the silicon layer. Embodiments include forming a patterned dielectric layer on an SOI substrate, forming sidewall spacers thereon, and etching the underlying silicon layer followed by oxidation or controlled etching to form the trench with downwardly decreasing side surfaces.

3 Claims, 7 Drawing Sheets

US 6,461,935 B2

METHOD OF MANUFACTURING TRENCH-SHAPED ISOLATOR

This application is a divisional of U.S. patent application Ser. No. 09/371,027, filed Aug. 10, 1999, now U.S. Pat. No. 6,372,599.

BACKGROUND OF THE INVENTION

1. Field of the Invention

The present invention relates to a semiconductor device having an SOI (silicon-on-insulator) structure with a silicon layer formed on an insulator layer, and to a method of manufacturing it.

2. Description of Related Art

FIG. 8 shows a semiconductor device having a conventional SOI structure. As illustrated therein, an insulator layer 102 is formed on a semiconductor substrate 101, and a silicon layer 103 is formed on the insulator layer 102 to give an SOI structure.

In the semiconductor element region comprising the silicon layer 103, formed are source/drain regions 103a through doping with an impurity such as phosphorus, arsenic or the like, or boron or the like, and, in the area between the source/drain regions 103a, formed is a gate electrode 107 on the silicon layer 103 via a gate oxide film 106 therebetween to give a MOSFET.

A trench 104 is formed at the element-isolation area of the silicon layer 103, and an insulating film 105 is formed within the inner wall of the trench 104 to give an element-isolation region, serving to isolate semiconductor elements from each other. As in FIG. 8, the bottom face of the silicon layer 103 makes an acute angle with the side of the element-isolation region (insulating film 105) adjacent thereto.

An interlayer insulating film 108 is formed on the SOI substrate having the MOSFET thereon, and a conductive layer 109 is formed on the interlayer insulating film 108. Contact holes for enabling electric connection between the conductive layer 109 and the source/drain regions 103a formed in the silicon layer 103 are formed through the interlayer insulating film 108 and filled with a conductor, via which the conductive layer 109 is electrically connected with the source/drain regions 103a.

In the element-isolation region of the semiconductor device having the SOI structure of that type, the bottom face of the silicon layer 103 makes an acute angle with the side of the element-isolation region (insulating film 105) adjacent thereto. In that condition, therefore, when the volume of the element-isolation region is varied through heat treatment to be effected after the formation of the element-isolation region, for example, through annealing to be effected after the formation of the oxide film 105 in the trench 104, or through heat treatment to be effected in forming the gate oxide film 106 after the formation of the element-isolation region, the volume variation shall make the silicon layer 103 have large stress at the acute-angled corners of its bottom.

A technique for relaxing the large stress at the acute-angled corners of the bottom of the silicon layer 103 is disclosed, for example, in Unexamined Japanese Patent Publication No.(HEI)6-216230. FIG. 9 shows an SOI structure for a semiconductor device illustrated in Unexamined Japanese Patent Publication No.(HEI)6-216230. As illustrated, the trench-shaped insulator of constructing an element-isolation region is so formed that its width in the cross section is continuously increased in the downward direction, in order that the bottom of the silicon layer does not make an angle with the element-isolation region adjacent thereto. Therefore, being different from that of FIG. 8, the semiconductor device of FIG. 9 has no angle that may produce large stress, and the bottom of the silicon layer in FIG. 9 is prevented from having any large stress. In FIG. 9, numeral references are the same as those in FIG. 8, provided that the element-isolation region 105 is formed of an isolating wall 105b in the trench 104 and a polysilicon layer 105a embedded therein.

In the semiconductor device noted above, however, the interface of the silicon layer adjacent to the insulator is formed to be convex toward the insulator. In this, therefore, when the stress resulting from the volume variation in the element-isolation region runs toward the silicon layer, it is concentrated in some parts in the silicon layer, as will be mentioned below. The problem caused by the stress concentration is that some lattice defects are formed in those parts with the stress concentrated.

The reason for the stress concentration is described with reference to FIG. 10. As illustrated, in the semiconductor device of FIG. 10, the interface between the silicon layer and the insulator (trench) is so formed that, reaching the insulating layer, it is curved toward the silicon layer but not toward the element-isolation region. In this, therefore, when the stress resulting from the volume variation in the element-isolation region runs toward the silicon layer, as indicated by the arrows in FIG. 10, a plurality of stress components running in that direction shall be concentrated in the part as designated by "X" therein. As a result, some lattice defects are formed in that part of the silicon layer.

Meanwhile a semiconductor device having a trench-shaped insulator of which the width is continuously decreased in the downward direction, is disclosed in IEDM (International Electron Devices Meeting) Technical Digest, 1997, p.591. However, the semiconductor device disclosed has a large depression at the surface of the trench-shaped insulator near the semiconductor element region adjacent thereto. Thus, in the case where a gate electrode extends over the trench-shaped insulator as well as the semiconductor element region, a portion of the gate electrode will be embedded in the depression of the insulator so that the distance between the semiconductor element region and the portion of the gate electrode located on the insulator will be shortened in comparison with the case of no depression. With this structure, when a transistor controllable with such a gate electrode is formed in the semiconductor element region, it will likely be influenced by an electric field from the portion of the gate electrode embedded in the depression of the adjacent insulator, that is, an electric field will be concentrated in the semiconductor element region near the depression. As a result, a reverse narrow channel effect decreasing a threshold voltage occurs and a parasitic MOSFET tends to be generated in the semiconductor element region near the depression. The concentration of an electric field may also cause a deterioration of the semiconductor element region, such as silicidation of a contact portion of the source/drain region of the transistor.

On the other side, Unexamined Japanese Patent Publication No. (HEI)9-8118 discloses a process for forming a trench-shaped insulator without a depression at the surface near the semiconductor element region adjacent thereto, but the width of the trench-shaped insulator formed is constant in the downward direction.

SUMMARY OF THE INVENTION

The object of the invention is to provide a semiconductor device in which the stress from the volume variation in the element-isolation region to the silicon layer is relaxed to thereby protect the silicon layer from having lattice defects therein and in which the surface of the trench-shaped insulator in the element-isolation region does not have a depression near the semiconductor element region, and to provide a method of manufacturing it.

The semiconductor device of the invention comprises an SOI substrate with a silicon layer formed on an insulating layer, and a semiconductor element region and an element-isolation region formed in the silicon layer, wherein; the element-isolation region is of a trench-shaped insulator formed adjacent to the semiconductor element region, and the trench-shaped insulator is provided with a portion which is adjacent to the semiconductor element region, of which the width is continuously decreased in the downward direction, and of which the surface is planarized near the semiconductor element region. In the device, even when the volume variation in the element-isolation region produces some stress running toward the silicon layer, the stress to the silicon layer could be well relaxed. In addition, because the surface of the trench-shaped insulator in the element-isolation region is made flat near the semiconductor element region, the concentration of an electric field in the semiconductor element region does not occur when a gate electrode is extended over the trench-shaped insulator and the semiconductor element region.

One method of manufacturing the semiconductor device of the invention comprises, forming, on an SOI substrate having a silicon layer formed on an insulating layer, a protective film having an unprotected portion of a predetermined pattern, forming an insulating film over the SOI substrate with the protective film, followed by etching the insulating film to leave an insulating side wall at the side of the unprotected portion of the protective film, anisotropically etching the silicon layer via the protective film and the insulating side wall both acting as a mask to form a trench in the silicon layer, and subjecting the silicon layer with the trench to a heat treatment to oxidize the side portion of the trench to thereby form a trench-shaped insulator having a width continuously decreased in the downward direction. In the method, the curved profile at the interface is controlled by varying the condition for oxidizing the side part of silicon.

Regarding the temperature for the heat treatment in the method, if it is too low, suitable oxidation could not be attained at such low temperatures. On the contrary, if it is too high, the oxide film could be formed even at such high temperatures. In this case, however, the interface could not be curved but is linear. For these reasons, it is desirable that the temperature for the heat treatment falls between 750° C. and 900° C.

Another method of manufacturing the semiconductor device of the invention comprises, forming, on an SOI structure having a silicon layer formed on an insulating layer, a protective film having an unprotected portion of a predetermined pattern, forming an insulating film over the SOT substrate with the protective film, followed by etching the insulating film to leave an insulating side wall at the side of the unprotected portion of the protective film, anisotropically etching the silicon layer via the protective film and the insulating side wall both acting as a mask to form a trench in the silicon layer, and isotropically etching the side portion of the trench to partially remove a portion of the silicon layer underlying the insulating side wall to obtain a trench having a width continuously decreased in the downward direction, and forming an insulator in the trench. In the method, the curved profile at the interface is controlled by varying the etching condition.

DETAILED DESCRIPTION OF THE PREFERRED EMBODIMENTS

Embodiment 1

Figure 1:
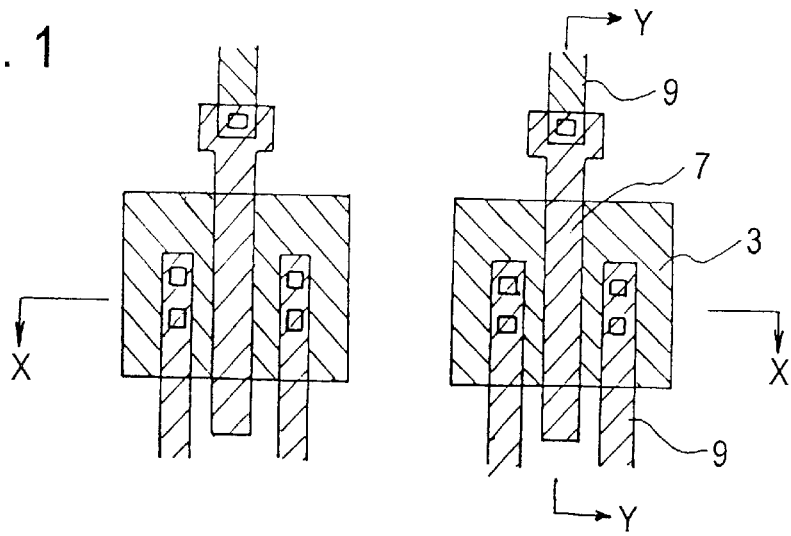
FIG. 1 is a top plan view of one embodiment of the semiconductor device of the invention.
Figure 2:
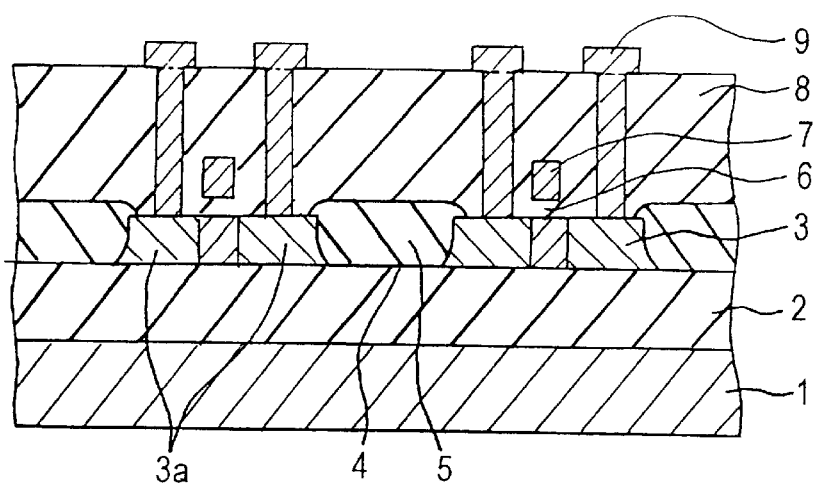
FIG. 2 is a sectional view of the semiconductor device of FIG. 1.
Figure 3:
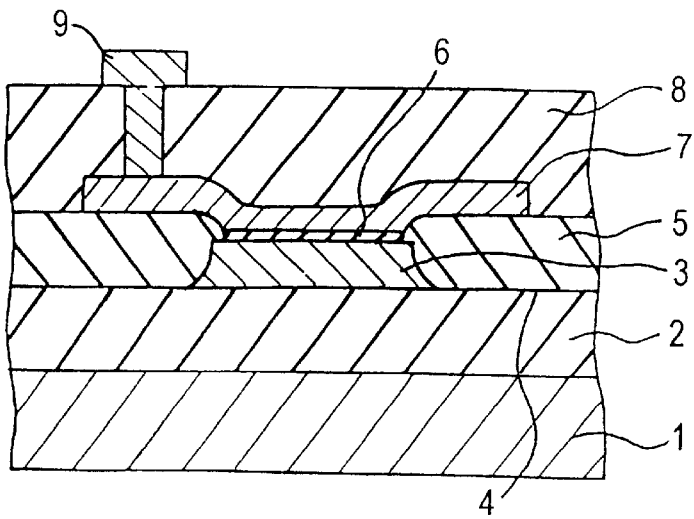
FIG. 3 is a sectional view of the semiconductor device of FIG. 1.

FIGS. 1 to 3 is a graphic view of Embodiment 1 of the semiconductor device of the invention having an SOI structure. FIG. 1 is a top plan view of the semiconductor device of this Embodiment. FIG. 2 is a cross-sectional view taken on line X—X of FIG. 1. FIG. 3 is a cross-sectional view taken on line Y—Y of FIG. 1. As illustrated, an insulating layer 2 of a silicon oxide film or the like is formed on the semiconductor substrate 1, and a silicon layer 3 is formed on the insulating layer 2 to give an SOI structure. In this, preferably, the thickness of the silicon layer 3 falls between 500 Å and 2000 Å.

In the semiconductor element region of the silicon layer 3, formed are source/drain regions 3a through doping with an impurity such as phosphorus, arsenic or the like, or boron or the like, and, on the silicon layer 3 via a gate oxide film 6 between the source/drain regions 3a, formed is a gate electrode 7 extended to the surface of the oxide film 5 in the element-isolation region to give a MOS transistor.

With this structure, a trench 4 is formed in the element-isolation area of the silicon layer 3, and an insulating film 5 of silicon oxide or the like is formed within the inner wall of the trench 4 to give an element-isolation region, serving to isolate semiconductor elements from each other. As in FIGS. 2,3, the silicon layer 3 is so formed that it has a concave profile in its cross section at the interface between the silicon layer 3 and the element-isolation region (insulating film 5). With that structure, even when some stress runs from the element-isolation region toward the silicon layer 3, it does not concentrate anywhere inside the silicon layer 3. Further the surface of the oxide film 5 is formed flatly, and therefore, the gate electrode located thereon does not have any portion which is embedded in the insulating film 5 near the semiconductor element region.

An interlayer insulating film 8 is formed on the SOI substrate having the MOS transistor thereon, and a conductive layer 9 of aluminium or the like is formed on the interlayer insulating film 8. Contact holes for enabling electric connection between the conductive layer 9 and the source/drain regions 3a formed in the silicon layer 3 are formed through the interlayer insulating film 8 and filled with a conductor, via which the conductive layer 9 is electrically connected with the source/drain regions 3a.

Now described hereinunder is a method of manufacturing the semiconductor device of FIG. 1. FIGS. 4A to 4C, and FIGS. 5A to 5C schematically illustrate one method of manufacturing the semiconductor device of FIG. 1.

Figure 4A:
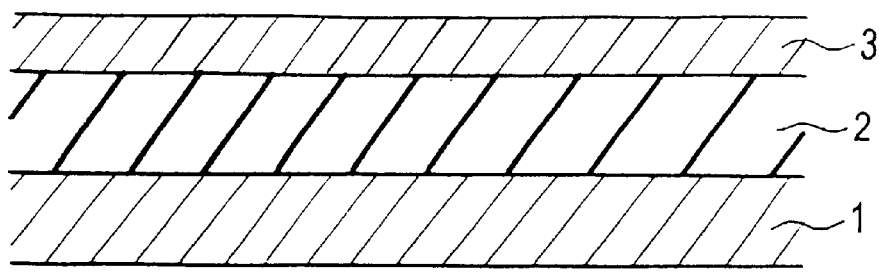
FIGS. 4A to 4C, and FIGS. 5A to 5C are graphic views schematically illustrating one method of manufacturing the semiconductor device of FIG. 1.

First, as in FIG. 4A, prepared is an SOI substrate having an insulating layer 2 of, for example, silicon oxide as formed on a semiconductor substrate 1 (silicon wafer) and having silicon layer 3 formed on the insulating layer 2. The SOI substrate may be any and every one to be formed according to a SIMOX (separation by implanted oxygen) method, a wafer-bonding method or the like. In this Embodiment, the SOI substrate is prepared according to a SIMOX method.

Figure 4B:
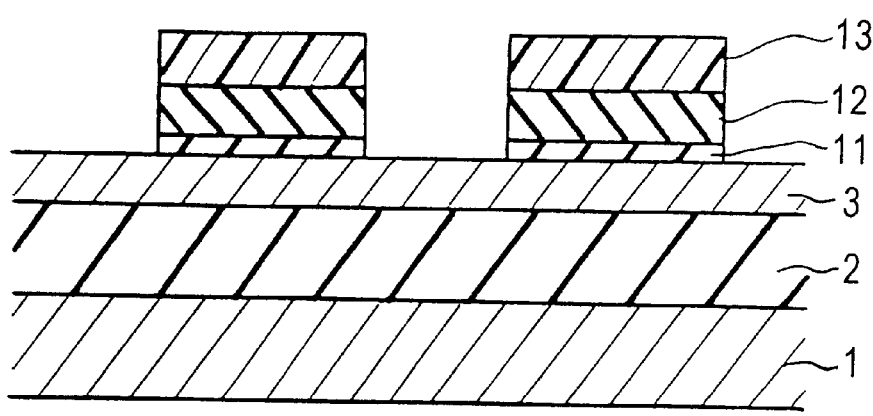

Next, as in FIG. 4B, a underlying oxide film 11 having a thickness of from 100 to 300 Å or so is formed on the silicon layer 3. This may be a TEOS (tetraethoxysilane) oxide film formed on the silicon layer 3, or may be a silicon oxide film as formed through oxidation of the silicon layer 3. A nitride film 12 having a thickness of 2000 Å or so is formed on the underlying oxide film 11 through deposition. Corresponding to the active region of the silicon layer 3, a resist 13 is patterned on the nitride film 12. Then, the nitride film 12 and the underlying oxide film 11 except those below the resist 13 are removed through dry etching.

Figure 4C:
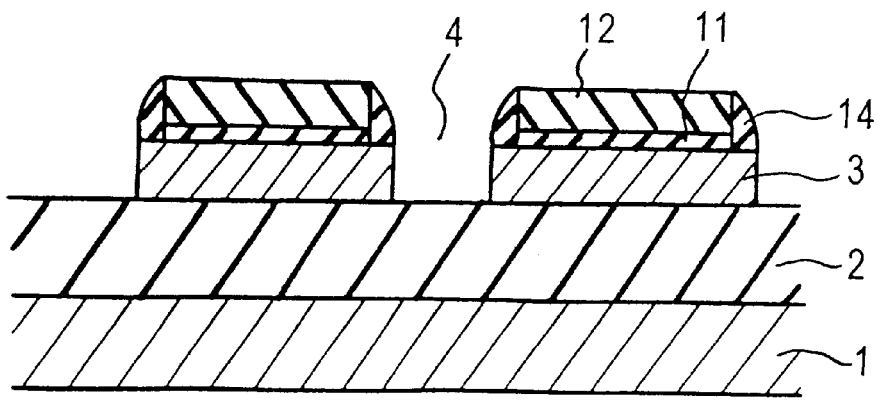

Next, as in FIG. 4C, the resist 13 is removed, and a TEOS oxide film having a thickness of 500 Å or so is formed through deposition. The TEOS oxide film is etched so as to form a insulating side wall 14 of the TEOS oxide film in a self-aligned manner only around the side wall of the nitride film 12 formed on the silicon layer 3. Though depending on the shape of the side wall of the silicon layer 3, it is desirable that the thickness of the side wall 14 in horizontal direction is about 200 Å or so. Via the nitride film 12 and the insulating side wall 14 thus formed, both acting as the mask, the silicon layer 3 is dry-etched under an anisotropic condition to thereby remove the silicon layer 3 except that below the nitride film 12 and the insulating side wall 14.

Figure 5A:
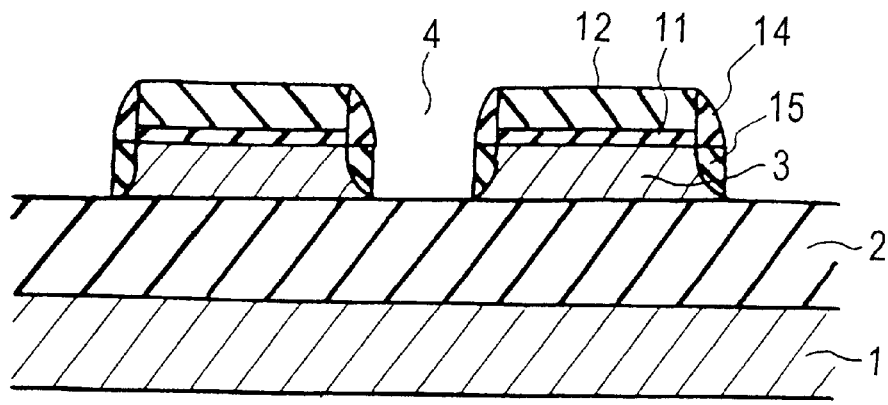

Next, as in FIG. 5A, the silicon layer 3 is oxidized by heating the SOI substrate in a wet atmosphere at a temperature falling between 750 and 900° C. or so, but preferably between 800 and 900° C. or so, thereby forming an oxide film 15 around the side wall of the silicon layer 3. The thickness of the oxide film 15 to be formed may have a thickness of from 100 to 500 Å or so.

Oxidizing the side wall of the silicon layer 3 at a temperature falling within the range enables the concave profile in the cross section of the silicon layer 3, at the interface between the silicon layer 3 and the element-isolation region to be formed at the element-isolation area 4. In this condition, the width of the semiconductor element region shall continuously increase in downward direction. Though depending on the thickness of the silicon layer 3 and also on the thickness of the oxide film 15 (the depth of grown oxide), it is desirable that the degree of increase in the width of the layer 3 reaches about 200 Å or so.

The radius of curvature of the interface to be formed in this step maybe 1000 Å or so. Though depending on the thickness of the oxide film 15, it is desirable that the radius of curvature is not smaller than 1000 Å. It is also desirable that the concave profile is formed at a position not higher than about 500 Å from the interface between the silicon layer 3 and the insulating layer 2.

Varying the treating temperature and the treating time in this step enables the interface to have a desired profile.

For example, when the side wall of the silicon layer 3 is oxidized at 1000° C., which is above the temperature range, to form the oxide film, the intended profile as in FIG. 3A, in which the interface reaching the insulating layer 2 is curved toward the element-isolation area, could not be obtained. When the side wall of the silicon layer 3 is oxidized at temperatures falling within the range as afore mentioned, the interface reaching the insulating layer 2 is preferably curved toward the element-isolation area 4.

Figure 5B:
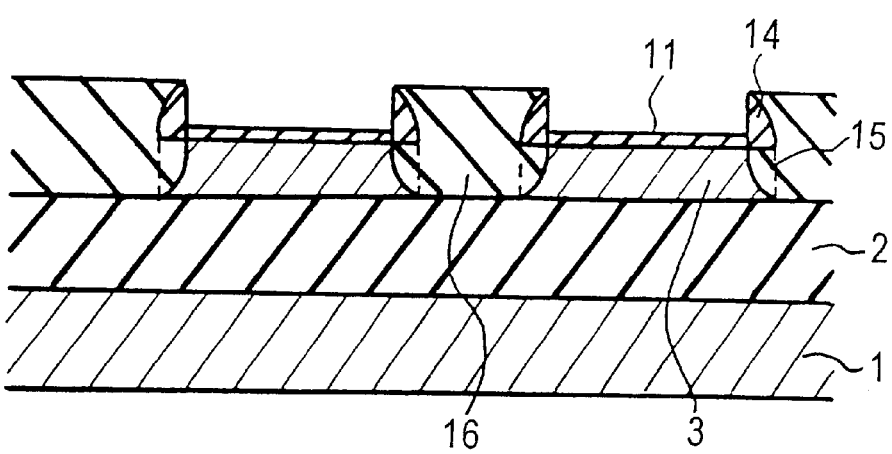

Next, as in FIG. 5B, an oxide film 16 of, for example, a TEOS oxide film or the like is formed inside the trench 4 through deposition in such a manner that the its surface is above the surface of the silicon layer 3 and above the surface of the element-isolation region, for example, in such a manner that the thickness of the oxide film 16 could be about 5000 Å or so. After this, the oxide film 16 thus formed through deposition is polished for planarization through CMP (chemical mechanical polishing) until the nitride film 12 is exposed out, and thereafter the nitride film 12 is removed through treatment with phosphoric acid at 160° C. or so.

Figure 5C:
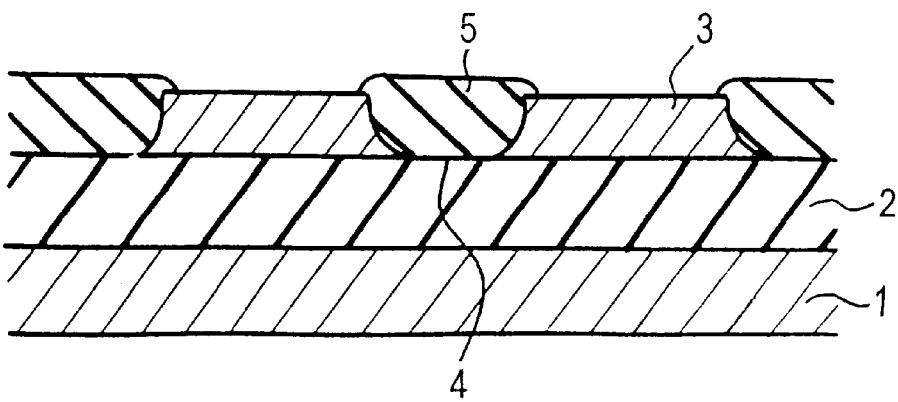

Next, as in FIG. 5C, the active region of the silicon layer 3 is processed for channel implantation, and the underlying oxide film 11 and the isolating side wall 14 are removed through treatment with hydrofluoric acid by which is formed the element-isolation region 5.

Next, as in FIGS. 1 to 3, a gate oxide film 6 (for example, having a thickness of 70 Å or so) and a gate electrode 7 having a thickness of 2000 Å or so are formed, and thereafter the active region of the silicon layer 3 is processed for source/drain implantation. Then, an interlayer insulating film 8 is formed, and a conductive layer 9 of aluminium or the like is patterned for interconnection on the interlayer insulating film 8. Contact holes for enabling electric connection between the interconnection pattern 9 and the source/drain regions are formed through the interlayer insulating film 8 and filled with a conductor, via which the interconnection pattern 9 is electrically connected with the source/drain regions to give a structure of SOI/MOS transistor.

In the semiconductor device of this Embodiment, the silicon layer 3 is provided with a portion of which the width in the cross section is continuously increased in the downward direction. In this, therefore, even when the volume of the oxide film having been embedded through deposition is varied by the heat treatment to be effected after the step of embedding the oxide film (for example, by the annealing treatment to be effected after the formation of the oxide film, or by the heat treatment to be effected for forming the gate oxide film) and even when the volume variation produces some stress that will run toward the silicon layer, the stress inside the silicon layer could be well relaxed.

In addition, in the device, the interface between the silicon layer 3 and the element-isolation region (insulating film 5) is formed to have a concave profile in the cross section. In this, therefore, even when the volume of the oxide film having been embedded through deposition is varied by the heat treatment to be effected after the step of embedding the oxide film (for example, by the annealing treatment to be effected after the formation of the oxide film, or by the heat treatment to be effected for forming the gate oxide film) and even when the volume variation produces some stress that will run toward the silicon layer, the stress inside the silicon layer could be well relaxed, and, in addition, the stress is prevented from being locally concentrated inside the silicon layer. As a result, in the device, forming lattice defects inside the silicon layer could be well retarded.

Where the oxide film is formed in the trench through CVD, the density of the CVD oxide film will be lower than that of the thermal oxide film as formed in the trench through thermal treatment. Therefore, the CVD oxide film will be shrunk to a higher degree by the subsequent heat treatment than the thermal oxide film, thereby producing larger stress that may run in the silicon layer. Even in that case, the device of the invention is free from stress concentration inside the silicon layer. Specifically, in the device of the invention having such a CVD oxide film, the stress inside the silicon layer could be well relaxed, not locally concentrating therein, and forming lattice defects inside the silicon layer could be well retarded.

In the semiconductor device of the Embodiment, the trench-shaped insulator does not have a depression near the semiconductor element region. Therefore, when a gate electrode is formed as extended on the trench-shaped insulator, the bottom of the gate electrode is made flat. As a result, the reliance of the gate electrode is improved and the occurrence of the parasitical MOS transistor is prevented.

In the method of manufacturing the semiconductor device of Embodiment 1, the curved profile at the interface between the silicon layer 3 and the element-isolation region (insulating film 5) can be controlled by varying the condition for oxidizing the side part of the silicon layer 3, for example, by varying the temperature condition and others for the oxidization.

Embodiment 2

Embodiment 2 is the same as Embodiment 1, except for the method of manufacturing the semiconductor device. In this, therefore, the description of the structure of the semiconductor device is omitted. FIGS. 6A to 6C, and FIGS. 7A to 7C schematically illustrate another method of manufacturing the semiconductor device of FIG. 1, and the method illustrated is for Embodiment 2.

Figure 6A:
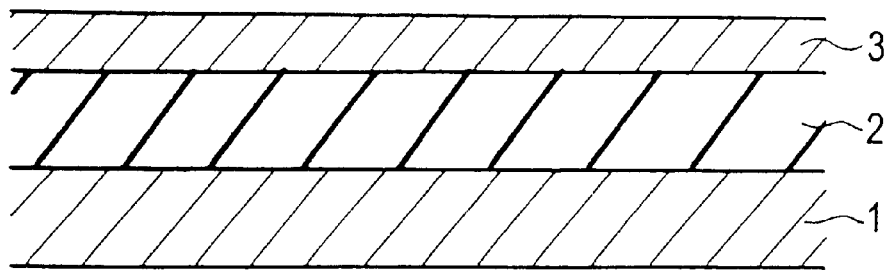
FIGS. 6A to 6C, and FIGS. 7A to 7C, are graphic views schematically illustrating another method of manufacturing the semiconductor device of FIG. 1.

First, as in FIG. 6A, prepared is an SOI substrate having an insulating layer 2 of, for example, silicon oxide as formed on a semiconductor substrate 1 and having silicon layer 3 formed on the insulating layer 2.

Figure 6B:
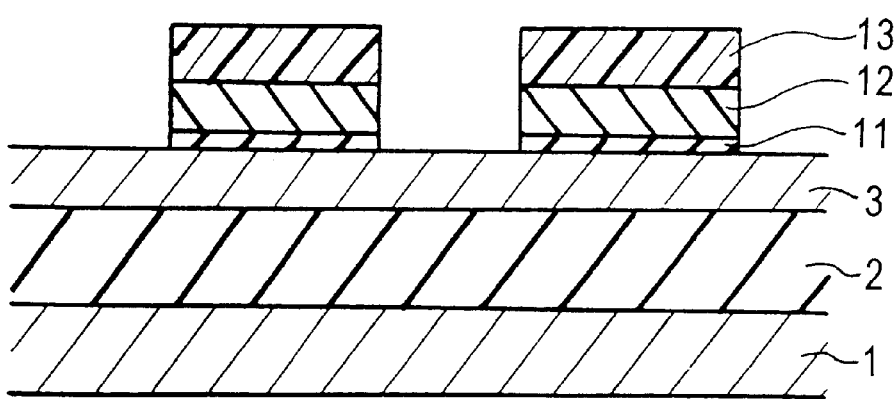

Next, as in FIG. 6B, a underlying oxide film 11 having a thickness of from 100 to 300 Å or so is formed on the silicon layer 3. This may be a TEOS oxide film formed on the silicon layer 3, or may be a silicon oxide film as formed through oxidation of the silicon layer 3. A nitride film 12 having a thickness of 2000 Å or so is formed on the underlying oxide film 11 through deposition. Corresponding to the active region of the silicon layer 3, a resist 13 is patterned on the nitride film 12. Then, the nitride film 12 and the underlying oxide film 11 except those below the resist 13 are removed through dry etching.

Figure 6C:
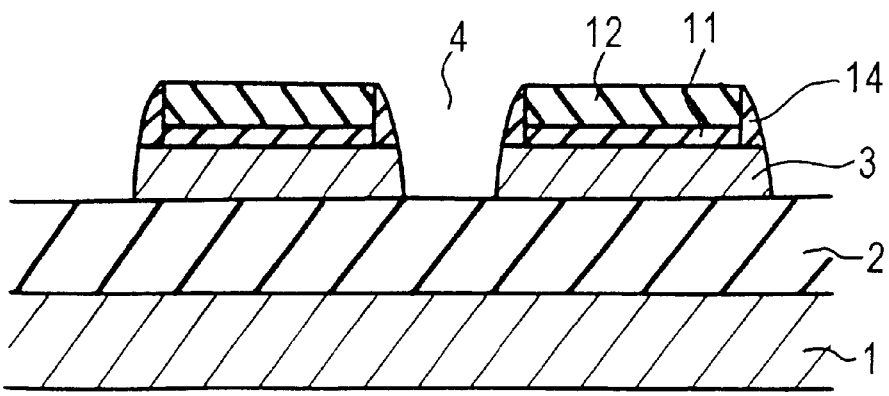

Next, as in FIG. 6C, the resist 13 is removed, and a TEOS oxide film having a thickness of 500 Å or so is formed through deposition. The TEOS oxide film is etched so as to form a insulating side wall 14 of the TEOS oxide film in a self-aligned manner only around the side wall of the nitride film 12 formed on the silicon layer 3. Though depending on the shape of the side wall of the silicon layer 3, it is desirable that the thickness of the side wall 14 in horizontal direction is about 200 Å or so. Via the nitride film 12 and the insulating side wall 14 thus formed, both acting as the mask, the silicon layer 3 is dry-etched under an anisotropic condition to thereby remove the silicon layer 3 except that below the nitride film 12 and the insulating side wall 14.

Figure 7A:
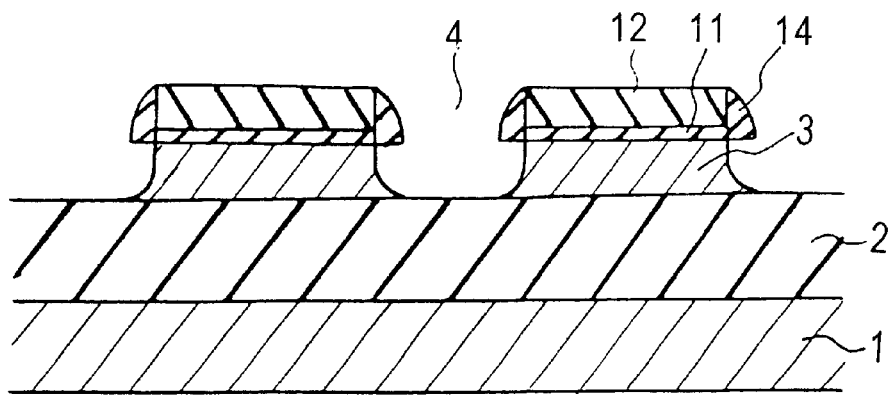

Next, as in FIG. 7A, the side wall of the silicon layer 3 is removed through isotropic dry etching, whereby the interface between the silicon layer 3 and the element-isolation region (oxide film 15) shall have a concave profile in the cross section. Depending on the etching condition, the cross-sectional profile of the interface may be varied in desired manner.

Figure 7B:
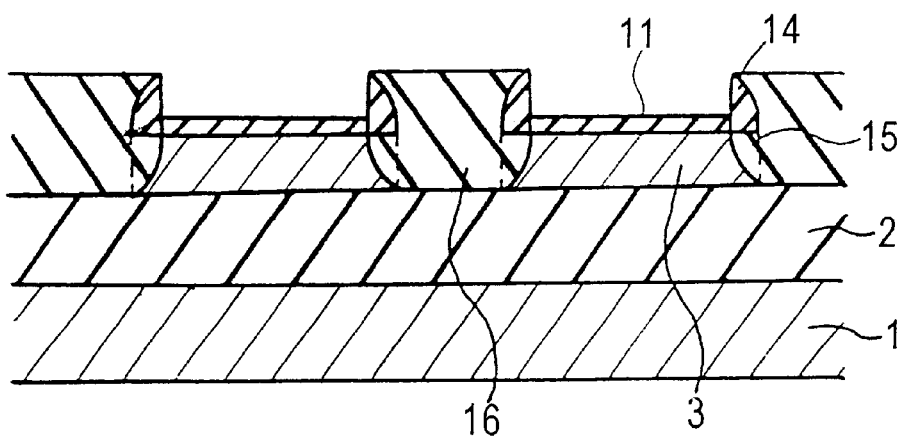

Next, as in FIG. 7B, an oxide film 16 of, for example, a TEOS oxide film or the like is formed inside the trench 4 through deposition in such a manner that the its surface is above the surface of the silicon layer 3 and above the surface of the element-isolations region, for example, in such a manner that the thickness of the oxide film 16 could be about 5000 Å or so. After this, the oxide film 16 thus formed through deposition is polished for planarization through CMP (chemical mechanical polishing) until the nitride film 12 is exposed out, and thereafter the nitride film 12 is removed through treatment with phosphoric acid at 160° C. or so.

Figure 7C:
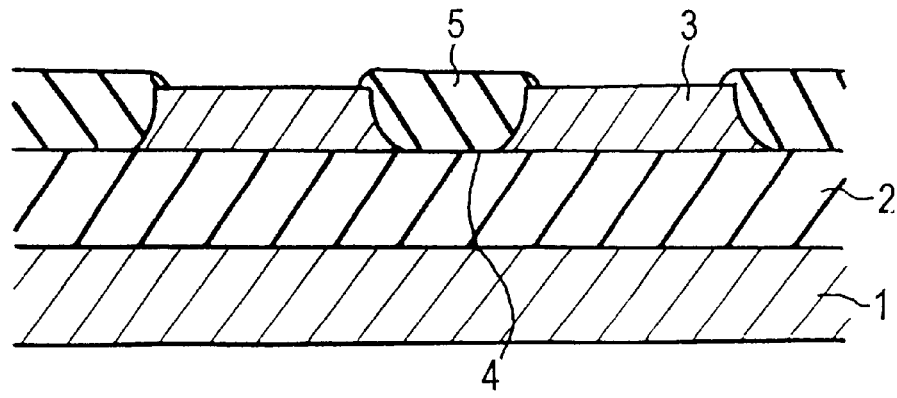
Figure 8:
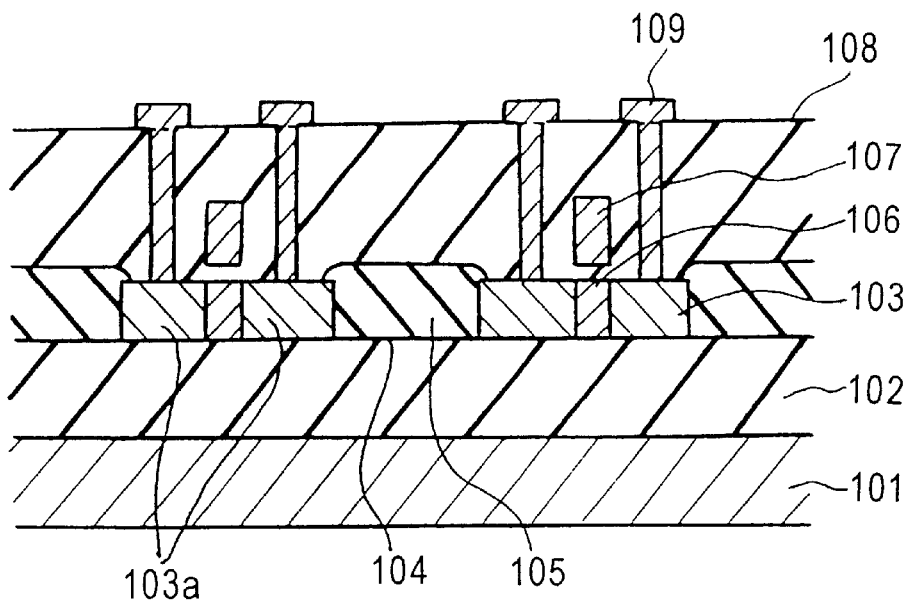
FIG. 8 is a graphic view of one example of a conventional semiconductor device.
Figure 9:
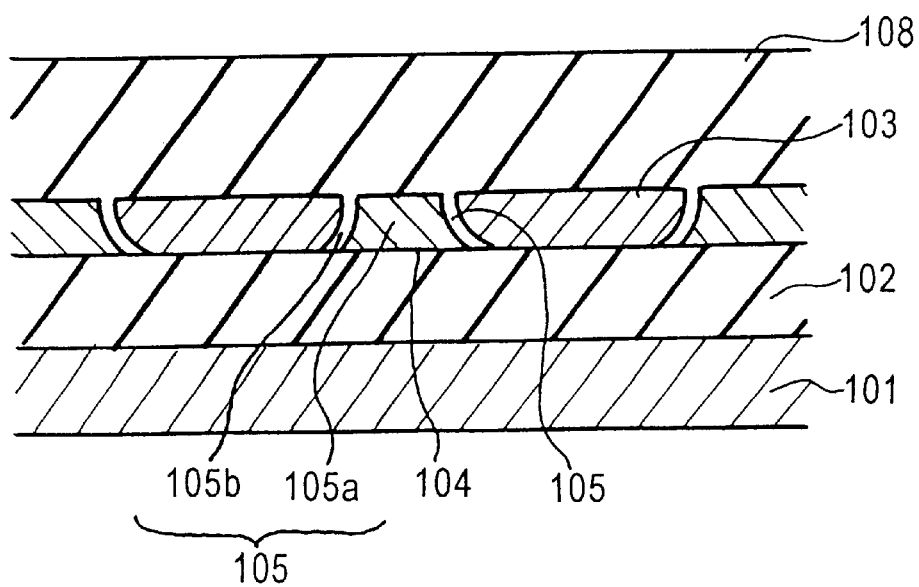
FIG. 9 is a graphic view of another example of a conventional semiconductor device.
Figure 10:
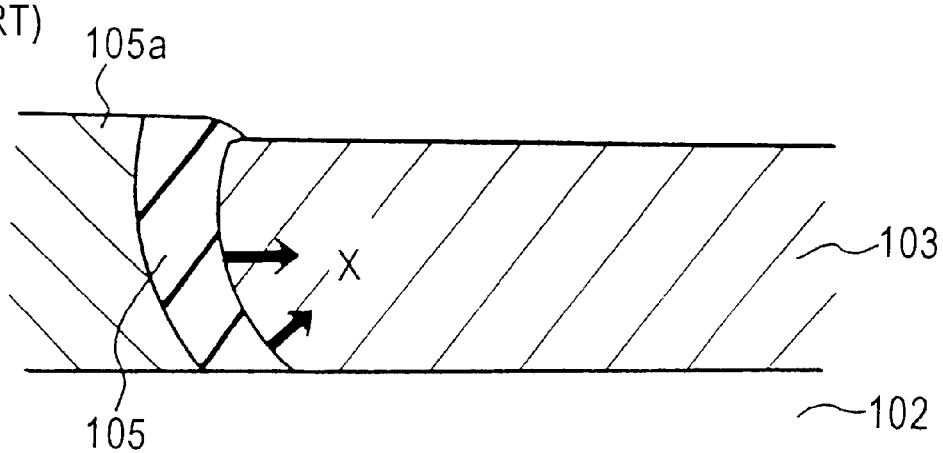
FIG. 10 is an explanatory view for the device of FIG. 8.

Next, as in FIG. 7C, the active region of the silicon layer 3 is processed for channel implantation, and the underlying oxide film 11 and the insulating side wall 14 are removed through treatment with hydrofluoric acid by which is formed the element-isolation region 5.

Finally, the active region of the silicon layer 3 is further processed in the same manner as in Embodiment 1 to give an SOI/MOS transistor.

In the method of manufacturing the semiconductor device of Embodiment 2, the curved profile at the interface between the silicon layer 3 and the element-isolation region (insulating film 5) can be controlled by varying the etching condition.

In Embodiments 1 and 2 illustrated herein, only an insulator is formed in the trenches, which, however, is not limitative. As one different modification of the structure of the trench, an insulating film may be formed on the side part of the trench (for example, by depositing an isolation on the inner wall of the trench, or by heat-treating the side part of the silicon layer exposed inside the trench), and a polysilicon or the like may be embedded in the trench via the insulating film.

While the presently preferred embodiments of the invention have been shown and described, it is to be understood that these disclosures are for the purpose of illustration and that various changes and modifications may be made without departing from the scope of the invention as set forth in the appended claims.

What is claimed is:

1. A method of manufacturing a semiconductor device comprising, forming, on an SOI substrate having a silicon layer formed on an insulating layer, a patterned dielectric film having side surfaces, forming an insulating film over the SOI substrate with the protective film, followed by etching the insulating film to leave an insulating side wall on the side surfaces of the patterned dielectric film, anisotropically etching the silicon layer via the patterned dielectric film and the insulating side wall both acting as a mask to form a trench in the silicon layer, and subjecting the silicon layer with the trench to a heat treatment to oxidize the side portion of the trench to thereby form a trench-shaped insulator having a width continuously decreased in the downward direction.

2. The method of manufacturing a semiconductor device as claimed in claim 1, wherein the temperature for the heat treatment falls between 750° C. and 900° C.

3. A method of manufacturing a semiconductor device comprising, forming, on an SOI structure having a silicon layer formed on an insulating layer, a patterned dielectric film having side surfaces, forming an insulating film over the SOI substrate with the patterned dielectric film, followed by etching the insulating film to leave an insulating side wall on the side surfaces of the patterned dielectric film, anisotropically etching the silicon layer via the dielectric film and the insulating side wall both acting as a mask to form a trench in the silicon layer, and isotropically etching the side portion of the trench to partially remove a portion of the silicon layer underlying the insulating side wall to obtain a trench having a width continuously decreased in the downward direction, and forming an insulator in the trench.

* * * * *